(12) United States Patent
Deligiannis

(10) Patent No.: US 7,737,762 B2
(45) Date of Patent: Jun. 15, 2010

(54) SOLID-STATE SWITCH

(75) Inventor: Jorge Deligiannis, Ottawa (CA)

(73) Assignee: Energate Inc, Ottawa, ON (CA)

( * ) Notice: Subject to any disclaimer, the term of this patent is extended or adjusted under 35 U.S.C. 154(b) by 496 days.

(21) Appl. No.: 11/853,883

(22) Filed: Sep. 12, 2007

(65) Prior Publication Data
US 2008/0218245 A1 Sep. 11, 2008

Related U.S. Application Data

(60) Provisional application No. 60/825,286, filed on Sep. 12, 2006.

(51) Int. Cl.
H03K 17/687 (2006.01)
(52) U.S. Cl. ............... 327/427; 327/374; 327/377; 327/423; 361/42
(58) Field of Classification Search ......... 327/374–377, 327/419, 423, 424, 427, 429, 432, 434, 437, 327/438, 441, 442; 361/42, 71
See application file for complete search history.

(56) References Cited

U.S. PATENT DOCUMENTS

| 4,170,740 | A |   | 10/1979 | Pernyeszi |
| 4,438,356 | A |   | 3/1984 | Fleischer |
| 4,575,642 | A |   | 3/1986 | Hochreutiner |
| 4,649,302 | A |   | 3/1987 | Damiano |
| RE35,836 | E |   | 7/1998 | Rodriguez |
| 5,920,452 | A | * | 7/1999 | Sullivan .................. 361/101 |
| 5,939,908 | A |   | 8/1999 | Moore |
| 6,691,923 | B2 |   | 2/2004 | Shearer |
| 7,254,004 | B2 | * | 8/2007 | Mladenik et al. .......... 361/93.1 |
| 2003/0231444 | A1 | * | 12/2003 | Kitahara et al. ............. 361/54 |
| 2009/0154033 | A1 | * | 6/2009 | Tomimbang ................ 361/42 |

* cited by examiner

Primary Examiner—Lincoln Donovan
Assistant Examiner—Shikha Goyal
(74) Attorney, Agent, or Firm—Mark Sprigings; Gowling, Lafleur Henderson LLP

(57) ABSTRACT

A solid state switch that employs a controller driven input and MOSFET power switching devices is disclosed. The controller can test for a short-circuit on the load side of the MOSFET power switching devices before putting the switch in a sustained conductive state.

8 Claims, 5 Drawing Sheets

SOLID-STATE SWITCH

CROSS-REFERENCE TO RELATED APPLICATIONS

This application claims priority from U.S. Provisional Patent Application Ser. No. 60/825,286, filed Sep. 12, 2006, the entirety of which is incorporated herein by reference.

FIELD OF INVENTION

The present invention relates to the field of solid state switching devices. In particular, to a solid-state switch with short circuit protection.

BACKGROUND

A switching circuit, such as a relay or a triac, is typically employed to switch high voltage/power circuits with a lower voltage/power control signal. The control signal is generated by a secondary (control) device. Current switching applications (for example a Class 2 application switching a voltage less than 30V) typically use switching technologies including relays or triac devices. Other applications may include opto-isolated Field Effect Transistors (FET); typically, these circuits are limited to maximum load currents of a few milliamps (mA).

FIG. 1 is a schematic representation of an exemplary relay switch 100 that works through energizing ($V_{Con}$) a coil 110 that acts as a magnet to pull down a gate 120 that connects a high voltage ($V_{High}$) to the power circuit and enables a current flow. Latching relays (not illustrated) can have one or two coils. An impulse closes the circuit and a feedback loop keeps the gate closed. A reverse pulse opens the circuit or a second coil is energized to open the circuit.

The following limitations with relays are based on the analysis of a Class 2 application operating below 30V alternating current (AC). These limitations may also apply to circuits operating outside the 30V AC range:

- When used in an application such as thermostat control, the operating voltage is typically 24V and the dissipation is 140 mW (for a non-latching relay). The operating range of a thermostat is between 18 and 30V, and at 30V the power dissipation increases to 220 mW. The thermostat control can typically run three devices (i.e. three loads each having an associated relay) resulting in a total power dissipation of approximately 600 mW. This adds significant heat to a temperature sensitive thermostatic control.
- A further limitation of relays is arcing. Arcing occurs when the load current momentarily bridges the air gap as the relay gate opens. This causes electromagnetic (EM) noise and radio frequency (RF) interference that can adversely affect the operation of the thermostat, or other devices, particularly RF devices. In addition, when opening the relay gate, the sudden cutting off of control current in the relay coil also causes a momentary voltage spike in the control circuit potentially causing failure in the electrical components of the device.
- Secondary parts such as voltage suppressors can be used to reduce the voltage arcing, although these add to cost and space requirements on circuit boards.
- A relay can also degrade over time and may be ineffective when switched from a high power to a low power application. The contact surfaces wear out which degrades their ability to form a proper contact in a low power application.
- The relay is also limited in the number of times it can switch in a lifetime, typically from 100K to 1M operations.
- Switching of the relay is limited to a few cycles per minute.
- In the event of a controller failure, the coil may be latched and continue running the appliance indefinitely (applies to latching relays only).
- There is no inherent short circuit protection on a relay device.
- Relays (regular and especially the latching type) are typically more expensive and occupy more volume than corresponding solid state devices.

The following limitations with triacs are based on the analysis of a Class 2 application operating below 30V AC. These limitations may also apply to circuits operating outside the 30V AC range:

- Triacs can only operate in an AC application (i.e. with an AC powered load).
- Triacs require a switching current and have a typical voltage drop of 1-2V. They are not suitable for millivolt (mV) applications.
- A limitation to triacs also relates to brownout conditions. In a brownout condition, the controlled voltage can drop to 18V. If a triac operates with a 2V drop, an overall 16V signal may be too low for proper operation.
- Since the control signal is 5 to 20 mA, the heat dissipation can be significant.
- Triacs usually require secondary circuitry to isolate the source and switching voltage. This is commonly done with opto-couplers which add to overall costs of the device.
- By way of an example, a Triac switching 300 mA of current per circuit with 3 circuits active at once having a 2V drop will dissipate 1.8 W of power, which will add significant thermal offset to a thermostat application where accurate temperature readings are desired. In comparison, an exemplary MOSFET circuit in a similar application will dissipate 0.054 W of power.
- Triacs may have leakage current through the device. In a low power application, the small (leakage) current may be interpreted as a false signal.

What is needed is a switching mechanism for switching high voltage/power circuits with a lower voltage/power control signal that mitigates some or all of the disadvantages described above.

SUMMARY OF INVENTION

A solid state switch that employs a controller driven input, and MOSFET power switching devices is disclosed. The controller can test for a short-circuit on the load side of the MOSFET power switching devices before putting the switch in a sustained conductive state.

In one aspect of the present invention there is provided, a method of operating a microprocessor controlled solid-state switch having a metal-oxide semiconductor field-effect transistor (MOSFET) based output stage for switching a load, the method comprising the steps of: receiving a command to put the solid-state switch in a conductive state; checking a wait timer for a zero duration; repeating the step of checking, when the duration is non-zero; generating an input signal pulse from the microprocessor to put the output stage in a conductive state, when the duration is zero; taking a sample voltage at the output stage; responsive to the sample voltage, determining that the switch is in one of a short-circuit condition and a non-short-circuit condition; resetting the wait timer to a pre-determined non-zero value and repeating the step of checking, when the switch is in a short-circuit condition; and generating an input signal from the microprocessor to put the output stage in a sustained conductive state, when the switch is in a non-short-circuit condition.

In another aspect of the present invention there is provided, a solid-state switch, for switching a load, comprising: a booster circuit for receiving a substantially square-wave input signal, electrically decoupling the signal, and generating a control signal that is an amplified version of an envelope of the input signal; a filter circuit for receiving the control signal and reshaping the signal into a output stage driving signal having smaller rise and fall times; an output stage having one or more metal-oxide semiconductor field-effect transistors (MOSFET), for receiving the output stage driving signal and responsive to the output stage driving signal putting the MOSFET in one of a conductive and a non-conductive state; a microprocessor for: receiving a command to put the solid-state switch in a conductive state; checking a wait timer for a zero duration; repeating the step of checking, when the duration is non-zero; generating an input signal pulse from the microprocessor to put the output stage in a conductive state, when the duration is zero; taking a sample voltage at the output stage; responsive to the sample voltage, determining that the switch is in one of a short-circuit condition and a non-short-circuit condition; resetting the wait timer to a pre-determined non-zero value and repeating the step of checking, when the switch is in a short-circuit condition; and generating an input signal from the microprocessor to put the output stage in a sustained conductive state, when the switch is in a non-short-circuit condition.

Other aspects and features of the present invention will become apparent to those ordinarily skilled in the art or science to which it pertains upon review of the following description of specific embodiments of the invention in conjunction with the accompanying figures.

BRIEF DESCRIPTION OF DRAWINGS

The present invention will be described in conjunction with drawings in which.

DETAILED DESCRIPTION

Figure 1:
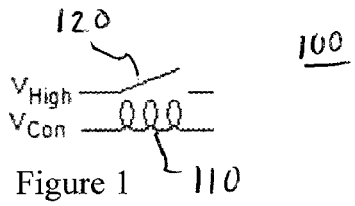
FIG. 1 is a schematic representation of an exemplary relay switch.
Figure 2:
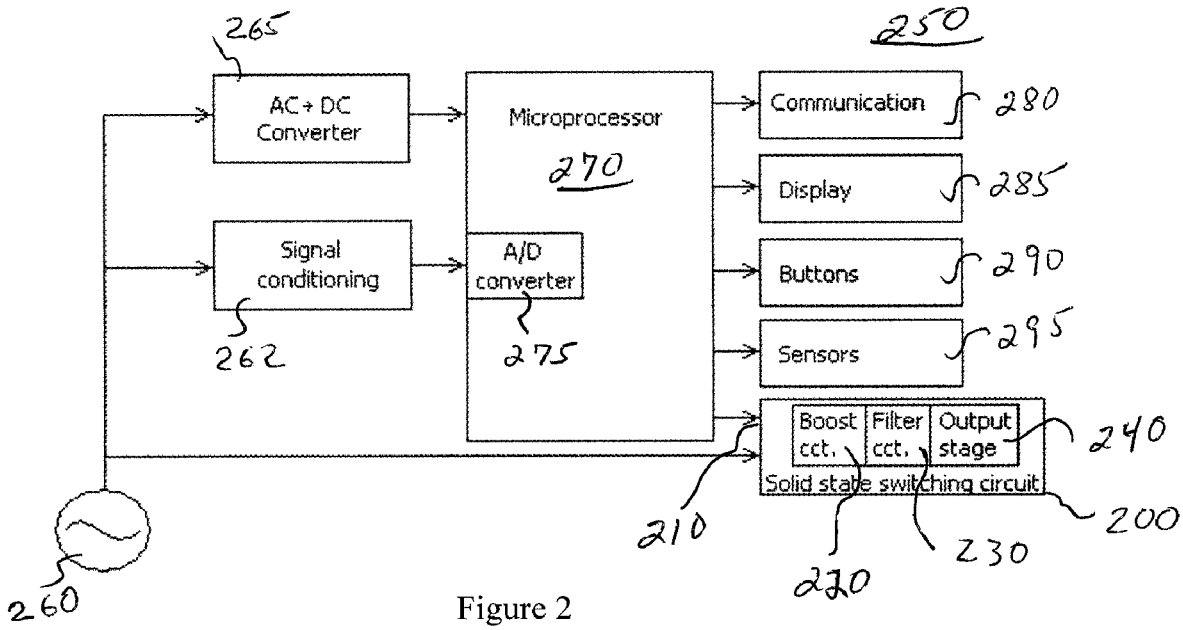
FIG. 2 is a schematic representation of an exemplary solid-state switch in situ in an exemplary thermostat control.

FIG. 2 is a schematic representation of an exemplary solid-state switch 200 in situ in an exemplary thermostat control 250. The solid-state switch 200 (herein after the switch) comprises a controller driven input 210, a boost circuit 220, a filter circuit (a.k.a. a latching circuit) 230, and an output stage 240. The controller driven input 210 can, for example, receive a signal from a microprocessor 270 (e.g. the Microchip Technology Inc. PIC 18F6527) or other similar well known programmable device (e.g. microcontrollers, Programmable Gate Arrays (PGA), Programmable Logic Arrays (PLA), Application-Specific Integrated Circuits (ASIC)) capable of providing a control function signal. The exemplary thermostat control 250 comprises a power supply 260, an alternating current (AC) to direct current (DC) converter 265, a signal conditioning unit 262, a microprocessor 270 having an analog to digital converter 275, a communication unit 280, a display unit 285, buttons 290 for user input, sensors 295 and one or more solid state switches 200.

Figure 3:
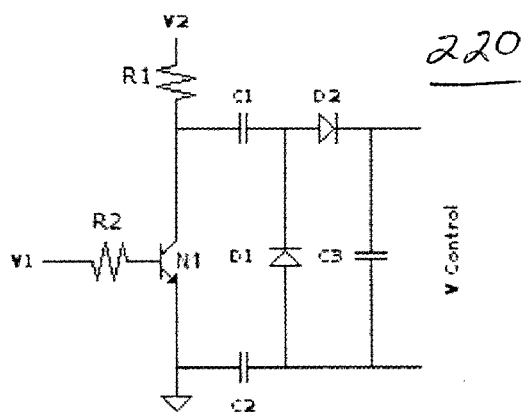
FIG. 3 is a schematic representation of an exemplary boost circuit.
Figure 4:
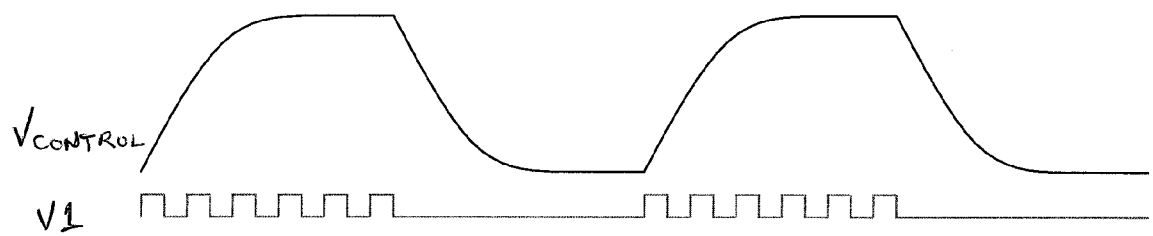
FIG. 4 is a schematic representation of an exemplary signal $V_{Control}$.

FIG. 3 is a schematic representation of an exemplary boost circuit 220. The boost circuit 220 is provided with a low power high frequency signal (V1) at the input 210 by the microprocessor 270. The signal V1 is boosted through the boosting circuitry through the combination of a resistive network (R1 & R2) and an NPN transistor (N1). Voltage V2 is substantially higher than the maximum voltage of the signal V1. Voltage V2 can be derived from the AC-DC converter 265 (connection not illustrated). Further, the circuit uses two capacitors (C1 & C2) to provide signal isolation. The isolated signal is passed through a peak-detector which uses two diodes (D1 & D2) and a capacitor (C3). The output of the boost circuit is referred to as $V_{Control}$. The smaller the capacitance of C1 & C2, the greater the isolation. The increased isolation comes at the expense of increased rise and fall times (i.e. increased wave-like attenuation of the signal) of $V_{Control}$. FIG. 4 is a schematic representation of an exemplary signal $V_{Control}$ and the signal V1 from which it was derived. In FIG. 4 and in all other figures in this document representing voltage signals the vertical dimension represents voltage increasing from bottom to top and the horizontal dimension represents time increasing from left to right, unless otherwise specified. The output signal $V_{Control}$ represented in FIG. 4 is the result of applying a square wave input signal V1 to the boost circuit 220. The increased rise and fall times can be seen in the sloped vertical signal components and the rounded shoulders of the signal $V_{Control}$.

Figure 5:
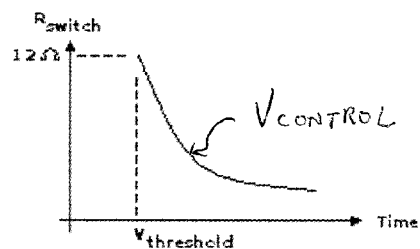
FIG. 5 is a schematic representation of an exemplary signal $V_{Threshold}$.

The output signal $V_{Control}$ is an amplified version of the envelope of signal V1. The waveform of signal ($V_{Control}$) is unfavorable for application to MOSFET devices due to the highly resistive nature of MOSFET devices when turned on at $V_{Threshold}$. FIG. 5 is a schematic representation of an exemplary signal $V_{Control}$. In FIG. 5 the vertical axis represents the internal resistance of a MOSFET device, increasing from bottom to top, and the horizontal axis represents time increasing from left to right. The label $V_{Threshold}$ on the horizontal axis represents the point in time that corresponds to the gate voltage applied to the MOSFET device achieving $V_{Threshold}$. In an illustrative example represented in FIG. 5, the MOSFET device is in series with a 24Ω load. At 24V and 1 A of load current, the power loss through the MOSFET during switching would be substantial when switching is prolonged (i.e. the time delay to achieving $V_{Threshold}$ is significant), which would significantly impact the operation of a temperature sensitive device such as, for example, a thermostat control. Further, the power dissipation through the MOSFET could lead to its destruction under short circuit conditions.

Figure 6:
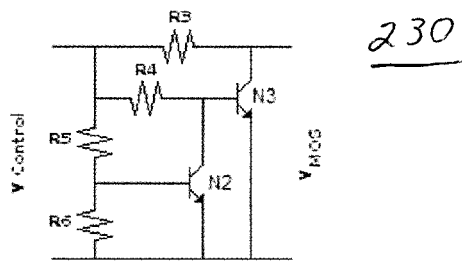
FIG. 6 is a schematic representation of an exemplary filter circuit.
Figure 7:
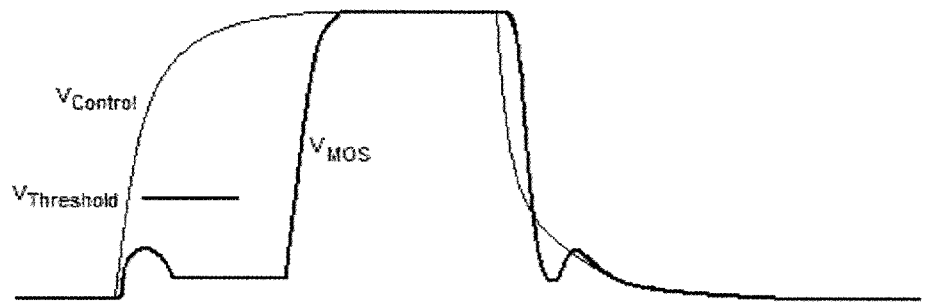
FIG. 7 is a schematic representation of an exemplary signal $V_{MOS}$.

FIG. 6 is a schematic representation of an exemplary filter circuit 230. To address the above described problem, the signal $V_{Control}$ is fed through the filtering circuit 230 comprised of a resistive network (R3 to R6) and transistor network (N2 & N3) that create an output signal $V_{MOS}$ for input to the output stage. FIG. 7 is a schematic representation of an exemplary signal $V_{MOS}$ and the signal $V_{Control}$ from which it was derived. The waveform ($V_{MOS}$) has a substantially square waveform that significantly limits the time in which the MOSFET transistors operate in a highly resistive mode during on/off transitions. By improving the rise and fall times compared to $V_{Control}$ the signal $V_{MOS}$ minimizes the delay in achieving $V_{Threshold}$ at the gate of the MOSFET devices.

Figure 8A:
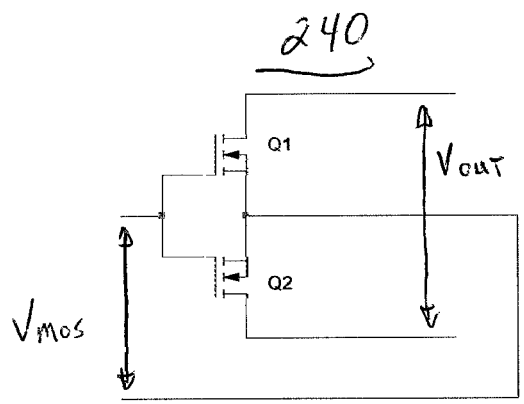
FIGS. 8A and 8B are schematic representations of exemplary output stages.

FIG. 8A is a schematic representation of an exemplary output stage 240. $V_{MOS}$ is fed into the output stage 240. The output stage 240 comprises a dual N-channel MOSFET circuit (Q1 and Q2) that controls the output voltage $V_{Out}$. The signal $V_{MOS}$ is applied to the gates of the MOSFET devices Q1, Q2. The load to be controlled (i.e. switched ON and OFF) and a high voltage ($V_{High}$) source (not illustrated) can be connected in series with the drains of the MOSFET devices Q1, Q2.

Figure 8B:
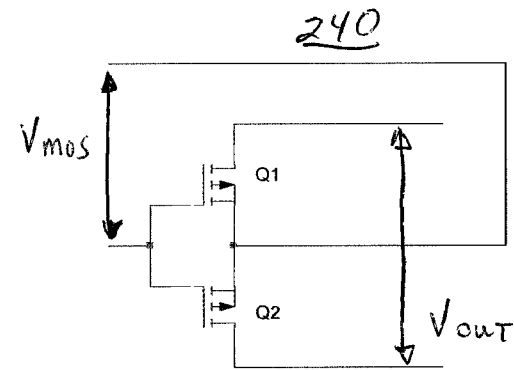

FIG. 8B is a schematic representation of an alternative exemplary output stage 240 comprising a dual P-channel MOSFET circuit (Q1 and Q2). The embodiment of FIG. 8B operates in substantially the same way as the embodiment of FIG. 8A except that signal $V_{MOS}$ is applied to the sources of the MOSFET devices Q1, Q2.

In a further alternative embodiment (not illustrated) for DC switching only, the output stage 240 comprises a single MOSFET device (Q1). $V_{High}$ and the load are connected respectively to the drain and the source of Q1. $V_{MOS}$ is applied between the gate and the source of Q1.

Figure 12:
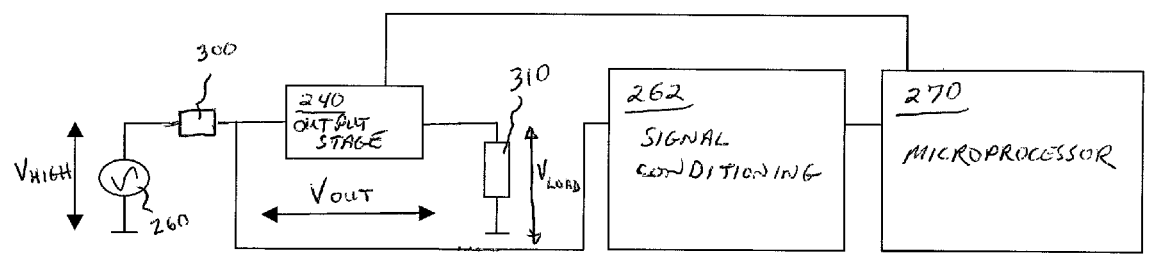
FIG. 12 is a schematic representation of a configuration for detecting short circuits at the output stage 240.

Prior to the microprocessor 270 signaling the output stage 240 into a sustained ON (i.e. conductive) state, it can pulse the input 210 of the switch 200 and sample the voltage at the output stage 240 to detect short circuits in either AC or DC applications. FIG. 12 is a schematic representation of a configuration for detecting short circuits at the output stage 240. The signal conditioning unit 262 is connected between the source of $V_{High}$ (e.g. power supply 260) and the output stage 240 in order to sense $V_{High}$. The microprocessor 270 in conjunction with the signal conditioning unit 262 is able to analyze the sensed voltage $V_{High}$.

Figure 9:
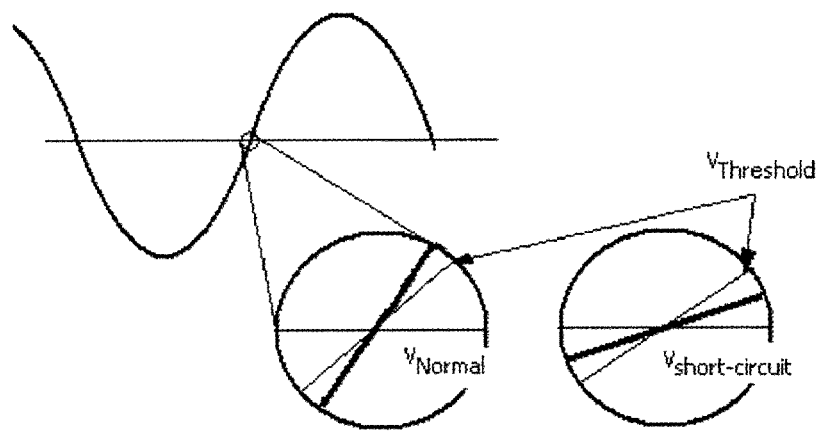
FIG. 9 is a schematic representation of an exemplary signal $V_{Out}$ illustrating a normal and a short circuit condition at zero crossing.

FIG. 9 is a schematic representation of an exemplary sensed (i.e. sampled) signal $V_{High}$ illustrating (in the expanded views) both a normal (i.e. non-short-circuit) ($V_{Normal}$) and a short circuit ($V_{short-circuit}$) condition at zero crossing. A typical AC signal has a zero crossing where the slope of the change in voltage is at a maximum. At the zero crossing, the microprocessor 270 pulses the input signal V1 to turn the output of the switch 200 on and tests the voltage at the crossing. If the slope (i.e. the rate of change of the voltage) is below a desired threshold ($V_{Threshold}$), the microprocessor 270 interprets that the load-side of the output stage 240 is in a short circuit state ($V_{short-circuit}$) and the microprocessor stops (i.e. de-asserts) the signal V1, allowing the output stage 240 to go into an OFF (i.e. open) state preventing damage to the output stage 240 and connected devices (e.g. the load).

Figure 11:
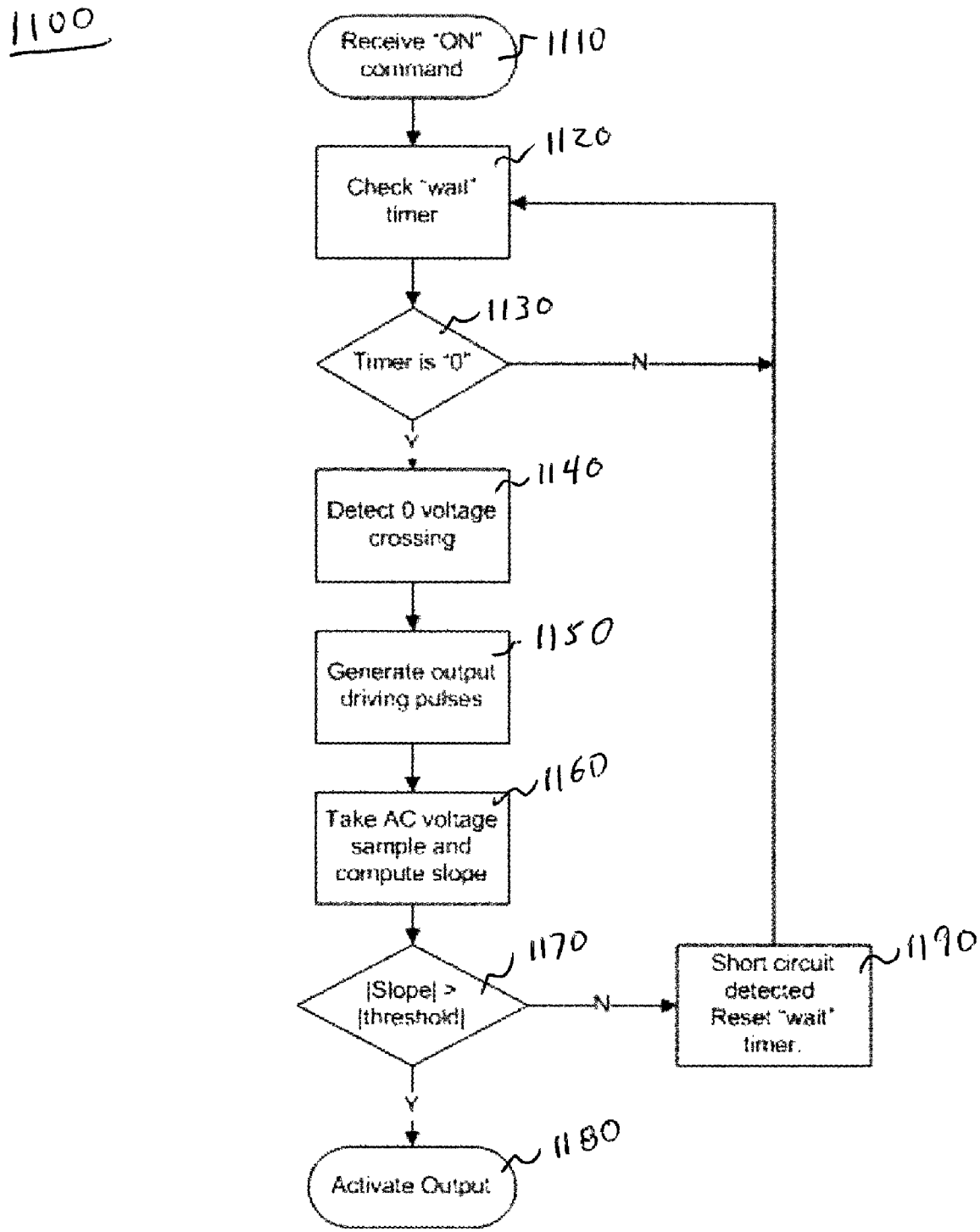
FIG. 11 is a flowchart representing steps in an exemplary control algorithm for the solid state switch.

FIG. 11 is a flowchart representing steps in an exemplary control algorithm (i.e. method) 1100 for the solid-state switch 200. The method 1100 allows the microprocessor 270 to detect an unexpected slope and reset the output stage 240 to an OFF state. The microprocessor 270 receives an ON command 1110 which, in the example of a thermostat application, may be a signal to turn on the fan, heat, AC, or other external circuits. A "wait" timer is checked 1120. When the timer duration is non-zero, it indicates that a short circuit fault has been previously detected and processing returns to step 1120. The timer duration is zero ("0") 1130 when no short circuit fault has been previously detected or when a previously non-zero timer duration has expired; processing continues at step 1140. The microprocessor 270 detects a zero voltage crossing 1140, generates a short duration series of output driving pulses 1150, takes a sample of the AC voltage and computes the slope 1160. If the signal slope (e.g. $V_{Normal}$) is greater than the threshold slope ($V_{Threshold}$) 1170 indicating a non-short-circuit (i.e. normal) condition, then the microprocessor activates the desired output 1180. If the signal slope (e.g. $V_{short-circuit}$) is less than the threshold slope ($V_{Threshold}$) indicating that a short circuit is detected, then the microprocessor resets the timer duration to a predetermined non-zero value 1190.

Figure 10:
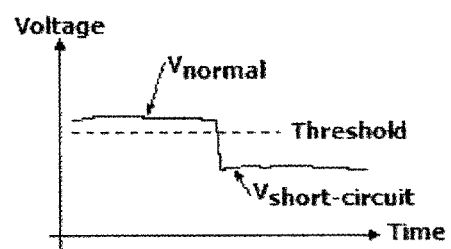
FIG. 10 is a schematic representation of a DC signal $V_{Out}$ illustrating a normal and a short circuit condition.

Referring again to FIG. 12, in an alternative embodiment of the apparatus and method for the solid-state switch 200, in order to detect a short circuit on the output stage 240 in a DC application (i.e. a DC load), an inductor 300 is placed in series with the load 310 between the power supply 260 (i.e. the source of $V_{High}$) and the output stage 240 and $V_{High}$ is sensed for analysis. In an alternative embodiment (not illustrated), the inductor is placed between the output stage 240 and the load and $V_{Load}$ is sensed for analysis. FIG. 10 is a schematic representation of an exemplary DC signal $V_{High}$ illustrating both a normal (i.e. non-short-circuit) and a short circuit condition. Instead of measuring the change in slope as in the AC application, the microprocessor 270 tests for a drop in voltage $V_{High}$ to below a pre-defined threshold. Upon short circuit detection, the microprocessor 270 resets the "wait" timer to a non-zero value.

In a further alternative embodiment for use in a DC application, no inductor is needed when the impedance of the power supply (i.e. the source of $V_{High}$) is sufficiently high so that the output stage 240 is not damaged during the brief period of the short-circuit analysis.

The method according to the present invention can be implemented by a computer program product comprising computer executable instructions stored on a computer-readable storage medium.

It will be apparent to one skilled in the art that numerous modifications and departures from the specific embodiments described herein may be made without departing from the spirit and scope of the present invention.

The invention claimed is:

1. A method of operating a microprocessor controlled solid-state switch having a metal-oxide semiconductor field-effect transistor (MOSFET) based output stage for switching a load, the method comprising the steps of:
   receiving a command to put the solid-state switch in a conductive state;
   checking a wait timer for a zero duration;
   repeating the step of checking, when the duration is non-zero;
   generating an input signal pulse from the microprocessor to put the output stage in a conductive state, when the duration is zero;
   taking a sample voltage at the output stage;
   responsive to the sample voltage, determining that the switch is in one of a short-circuit condition and a non-short-circuit condition;
   resetting the wait timer to a pre-determined non-zero value and repeating the step of checking, when the switch is in a short-circuit condition; and generating an input signal from the microprocessor to put the output stage in a sustained conductive state, when the switch is in a non-short-circuit condition.

2. The method of claim 1, wherein the load is connected via the switch to an alternating current (AC) power supply, the output stage having two MOSFET, and the method further comprises the steps of:
   detecting a zero voltage crossing on the output stage, before the step of generating an input signal pulse;
   the step of taking a sample voltage, further wherein the sample voltage is the output voltage of the power supply and the step further comprising computing the slope of the sample voltage; and
   the step of determining, further comprising determining the switch is in a short-circuit condition when the slope is not greater than a pre-determined threshold and determining the switch is in a non-short-circuit condition when the slope is greater than the pre-determined threshold.

3. The method of claim 1, wherein the load is connected via the switch to a direct current (DC) power supply, optionally an inductor is connected between the power supply and the switch, the output stage having one or more MOSFET, and the method further comprises the steps of:
   the step of taking a sample voltage, further wherein the sample voltage is the output voltage of the power supply; and
   the step of determining, further comprising determining the switch is in a short-circuit condition when the sample voltage is not greater than a pre-determined threshold and determining the switch is in a non-short-circuit condition when the sample voltage is greater than the pre-determined threshold.

4. The method of claim 1, wherein the load is connected via the switch to a direct current (DC) power supply, optionally an inductor is connected between the switch and the load, the output stage having one or more MOSFET, and the method further comprises the steps of:
   the step of taking a sample voltage, further wherein the sample voltage is the voltage across the load; and
   the step of determining, further comprising determining the switch is in a short-circuit condition when the voltage across the load is not greater than a pre-determined threshold and determining the switch is in a non-short-circuit condition when the voltage across the load is greater than the pre-determined threshold.

5. A solid-state switch, for switching a load, comprising:
   a booster circuit for receiving a substantially square-wave input signal, electrically decoupling the signal, and generating a control signal that is an amplified version of an envelope of the input signal;
   a filter circuit for receiving the control signal and reshaping the signal into a output stage driving signal having smaller rise and fall times;
   an output stage having one or more metal-oxide semiconductor field-effect transistors (MOSFET), for receiving the output stage driving signal and responsive to the output stage driving signal putting the MOSFET in one of a conductive and a non-conductive state;
   a microprocessor for:
      receiving a command to put the solid-state switch in a conductive state;
      checking a wait timer for a zero duration;
      repeating the step of checking, when the duration is non-zero;
      generating an input signal pulse from the microprocessor to put the output stage in a conductive state, when the duration is zero;
      taking a sample voltage at the output stage;
      responsive to the sample voltage, determining that the switch is in one of a short-circuit condition and a non-short-circuit condition;
      resetting the wait timer to a pre-determined non-zero value and repeating the step of checking, when the switch is in a short-circuit condition; and
      generating an input signal from the microprocessor to put the output stage in a sustained conductive state, when the switch is in a non-short-circuit condition.

6. The solid-state switch of claim 5, wherein the load is connected via the switch to an alternating current (AC) power supply, the output stage having two MOSFET, and the microprocessor further for:
   detecting a zero voltage crossing on the output stage, before the step of generating an input signal pulse;
   wherein the sample voltage is the output voltage of the power supply and the taking a sample voltage further comprising computing the slope of the sample voltage; and
   determining the switch is in a short-circuit condition when the slope is not greater than a pre-determined threshold and determining the switch is in a non-short-circuit condition when the slope is greater than the pre-determined threshold.

7. The solid-state switch of claim 5, wherein the load is connected via the switch to a direct current (DC) power supply, optionally an inductor is connected between the power supply and the switch, and the microprocessor further for:
   wherein the sample voltage is the output voltage of the power supply; and
   determining the switch is in a short-circuit condition when the sample voltage is not greater than a pre-determined threshold and determining the switch is in a non-short-circuit condition when the sample voltage is greater than the pre-determined threshold.

8. The solid-state switch of claim 5, wherein the load is connected via the switch to a direct current (DC) power supply, optionally an inductor is connected between the switch and the load, and the microprocessor further for:
   wherein the sample voltage is the voltage across the load; and
   determining the switch is in a short-circuit condition when the voltage across the load is not greater than a pre-determined threshold and determining the switch is in a non-short-circuit condition when the voltage across the load is greater than the pre-determined threshold.

* * * * *